United States Patent
Mitani et al.

(10) Patent No.: US 7,157,985 B2
(45) Date of Patent: Jan. 2, 2007

(54) PLL MODULATION CIRCUIT AND POLAR MODULATION APPARATUS

(75) Inventors: Yosuke Mitani, Yokosuka (JP); Shunsuke Hirano, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 88 days.

(21) Appl. No.: 11/078,704

(22) Filed: Mar. 14, 2005

(65) Prior Publication Data

US 2005/0242889 A1   Nov. 3, 2005

(30) Foreign Application Priority Data

Mar. 15, 2004  (JP) ............................. 2004-073171

(51) Int. Cl.
*H03C 3/00* (2006.01)

(52) U.S. Cl. ...................... 332/119; 332/120; 332/123; 332/127; 332/128; 375/302

(58) Field of Classification Search ................ 375/302; 332/119, 120, 123, 127, 128

See application file for complete search history.

(56) References Cited

U.S. PATENT DOCUMENTS 6,211,747 B1    4/2001   Trichet et al.
6,933,798 B1 *  8/2005   Hammes et al. ............. 332/127
7,015,738 B1 *  3/2006   Cao ........................... 327/159

\* cited by examiner

*Primary Examiner*—Arnold Kinkead
(74) *Attorney, Agent, or Firm*—Stevens, Davis, Miller & Mosher, LLP

(57) ABSTRACT

First and second calibration signals (308, 309) are sent to a frequency divider (102) and an adder (116) of a PLL section (100A), demodulated in a demodulator (111), filtered through a low pass filter (113) and a high pass filter (114) and thereafter sent to a modulation signal control circuit (115). The modulation signal control circuit (115) generates control information (318) in comparison with the phase and amplitude of the first and second calibration signals (308 and 309) and sends the control information (318) to a modulation control signal generator (106). Modulation control signal generator (106) holds the control information (318) and controls the values of the first modulation signal and second modulation signal sent to the frequency divider (102) and adder (116) on the based on the control information (318) held in modulation operation.

5 Claims, 9 Drawing Sheets

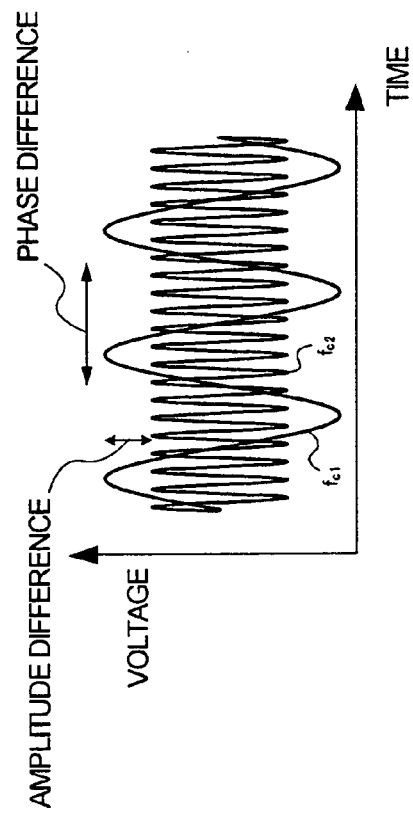
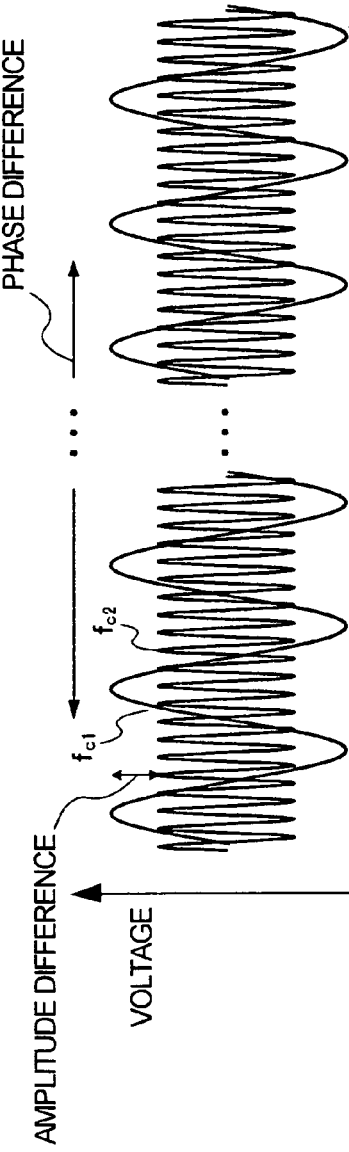
FIG.10A
FIG.10B
FIG.10

PLL MODULATION CIRCUIT AND POLAR MODULATION APPARATUS

BACKGROUND OF THE INVENTION

1. Field of the Invention

The present invention relates to PLL modulation circuit and polar modulation apparatus in wireless communication apparatus.

2. Description of the Related Art

Generally speaking, the PLL (Phase Locked Loop) modulation circuit is expected to realize low costs, low power consumption, and excellent noise characteristics and modulation accuracy. To improve the modulation accuracy of a PLL modulation circuit, the PLL frequency bandwidth (i.e. PLL bandwidth) is preferably wider than the frequency bandwidth of the modulation signal (i.e. modulation bandwidth).

However, widening the bandwidth of the PLL modulation circuit has the risk of causing deterioration in noise characteristics. So, as a technique for enabling a wideband PLL modulation circuit, two-point modulation is presently proposed whereby the bandwidth of a PLL modulation circuit is set narrower than the bandwidth of a modulation signal and modulation is performed inside and outside the bandwidth of the PLL modulation circuit at two different points (see, for example, U.S. Pat. No. 6,211,747).

FIG. 1 shows a simplified view of a conventional wideband PLL modulation circuit. The conventional PLL modulation circuit shown in FIG. 1 has a PLL section which includes: voltage controlled oscillator (VCO) 1 that changes the oscillation frequency in accordance with the voltage applied to a control voltage terminal (Vt); frequency divider 2 that divides the frequency of an RF modulation signal (high frequency modulation signal) outputted from VCO1; phase comparator 4 that compares the phase of an output signal of frequency divider 2 and the phase of a reference signal and outputs a signal in accordance with the phase difference between the two signals; and loop filter 3 that equalizes the output signal of phase comparator 4.

In addition, the above conventional PLL modulation circuit has: modulation sensitivity table 7 that outputs a signal based on a modulation signal in accordance with modulation sensitivity characteristics; D/A convertor 10 that adjusts the gain of an output signal in accordance with a gain control signal from controller 6 and converts the output signal of modulation sensitivity table 7 into an analogue voltage; delta sigma modulator 9 that delta sigma modulates a signal combining the output signal of modulation sensitivity table 7 and channel selection information and outputs the result as to frequency divider 2 as a frequency division ratio; and A/D convertor 11 that outputs the voltage value at the control voltage terminal (Vt) into a digital signal and outputs the result to controller 6. Now, factors that influence the modulation accuracy of two-point modulation will be described below. Major factors that influence the modulation accuracy of two point modulation include the modulation level and the time gap between the two points. First, the modulation level will be explained. As mentioned above, two-point modulation refers to the scheme of performing modulation at two different points. FIG. 3 shows frequency characteristics of a PLL modulation circuit utilizing two-point modulation. This PLL modulation circuit has a transfer function of H(s), wheres =jω. H(s) has low pass characteristics such as shown in FIG. 3. When a modulation signal is added to a frequency division ratio set in frequency divider 2, a low pass filter of the transfer function H(s) blocks the high frequency component and allows only the low frequency component to pass. Meanwhile, when the modulation signal is added to the control voltage terminal of VCO 1, a high pass filter of the transfer function of 1-H(s) shown in FIG. 3 blocks the low frequency component and allows only the high frequency component to pass.

The two modulation components are added in the control voltage terminal of VCO1, so that the modulation signal achieves flat characteristics such as shown by the broken line in FIG. 3 and is sent to VCO1. As a result, it is possible to output from VCO1 wideband RF modulation signal 307 that goes beyond the bandwidth of the PLL modulation circuit. Now, a case will be described below where the modulation signal does not achieve flat characteristics. When a modulation signal cannot maintain flat characteristics, this might cause deterioration in modulation accuracy.

It is when the amplitude of the modulation signal inputted in the control voltage terminal of VCO1 and the modulation sensitivity of VCO 1 are not consistent that flat characteristics fail. The modulation sensitivity refers to the conversion gain obtained upon converting the amplitude of a modulation signal inputted in the control voltage terminal of VCO1 to a frequency deviation of RF modulation signal 307 outputted from VCO 1. The unit is [Hz/V]. Also, the ratio of the frequency of the modulation signal and the maximum frequency deviation is referred to as the modulation level.

When the amplitude of the modulation signal is not consistent with the modulation sensitivity, the transfer function 1-H(s) will fluctuate, as shown in FIG. 4. FIG. 4 illustrates the transfer function 1-H(s) with a deviation of a. In this case, as shown by the broken line in FIG. 4, the gain is high at higher frequencies and the combined characteristics with H(s) become non-flat. This is a factor that causes deterioration in modulation accuracy.

FIG. 5 shows an example of control voltage versus output frequency characteristics of the general VCO. The voltage versus frequency slope represents the modulation sensitivity. FIG. 5 shows that in this VCO the modulation sensitivity changes with the oscillation frequency. FIG. 6 shows oscillation frequency versus modulation sensitivity characteristics of the general VCO. FIG. 6 shows that the modulation sensitivity changes with the oscillation frequency. Now, a case will be described below where the control voltage (the amplitude of a modulation signal) needs to be changed in accordance with the characteristics of the modulation sensitivity of the VCO that change with the oscillation frequency. Assume that in VCO 1 the frequency is 2 GHz and the modulation sensitivity is 100 MHz/v and that the maximum frequency deviation of a modulation signal is 5 MHz. In this case, a signal having a maximum amplitude of 50 mV needs to be inputted in the control voltage terminal. However, assume now that the frequency of VCO1 becomes 2.1 GHz and the modulation sensitivity becomes 80 MHz/V. In this case, a signal having a maximum amplitude of 62.5 mV needs to be inputted in the control voltage terminal. That is, to obtain RF modulation signals having the same frequency deviation at different oscillation frequencies, it is necessary to change the amplitude of the modulation signals inputted in the control voltage terminal of the VCO in accordance with the oscillation frequency of the VCO and adjust the modulation level.

Incidentally, the modulation sensitivity with respect to the modulation component in the frequency division ratio set in frequency divider 2 is the frequency of the reference signal and does not change with the frequency of VCO 1. For example, a case will be described here where the frequency of VCO1 is 2 GHz, the frequency of a reference signal is 1

MHz, and the maximum frequency deviation of a modulation signal is 5 MHz. In this case, the maximum width of change of the frequency division ratio is 5. That is, this calculation does not depend on the frequency of VCO 1.

The conventional PLL modulation circuit of FIG. 1 holds the oscillation frequency versus modulation sensitivity characteristics of VCO 1 in table 7 and calculates how much the control voltage fluctuates when the channel frequency changes, thereby correcting the modulation level and adjusting the gain of the D/A convertor.

The components making up the VCO have individual differences (variations) due to the manufacturing and have different values. Consequently, the modulation sensitivity characteristics vary on a per LSI basis. As a solution to the problem that the modulation sensitivity characteristics change per LSI due to the above-noted variations between individual components, the conventional PLL modulation circuit needs to measure the modulation sensitivity in association with the frequency on a per LSI basis and hold the results in modulation sensitivity table 7.

However, to prepare modulation sensitivity table 7, the measurement of the modulation sensitivity has to be carried out for all channel frequencies for use, and with this the frequency of the PLL modulation circuit needs to be changed by the same number of times as the number of measurement points. Thus, preparing modulation sensitivity table 7 requires a great amount of time and might even increase manufacturing costs. Next, the time gap between two points will be explained. In two point modulation, after modulation is performed at two points, the values of the modulation signals are added and the result is inputted in the control voltage terminal of the VCO. If then there is a time gap between the modulation signals, this lowers the modulation accuracy. The above description of a conventional PLL modulation circuit does not explain the method of adjusting the time gap between two points, and the setting of adequate timings poses difficulty.

However, as described above, the conventional PLL modulation circuit suffers decrease in the modulation level and time gap between two points and thus has difficulty improving the modulation accuracy.

SUMMARY OF THE INVENTION

It is therefore an object of the present invention to provide a PLL modulation circuit and polar modulation apparatus that improves modulation accuracy.

The above-noted object of the present invention is achieved by means of a configuration having: a PLL section including a voltage controlled oscillator, a frequency divider that frequency divides an output signal of the voltage controlled oscillator, a phase comparator that compares an output signal of the frequency divider and a reference signal, a loop filter that equalizes an output of the phase comparator; and an adder that adds an output of the loop filter and a second modulation input signal and sends a result to the voltage controlled oscillator; a first modulation signal generator that, based on a modulation signal inputted, generates a first modulation input signal to input in the frequency divider in the PLL section; a second modulation signal generator that, based on the modulation signal inputted, generates the second modulation input signal to input in the adder in the PLL section; a first calibration signal generator that generates a first calibration signal within a PLL bandwidth to input in the frequency divider in the PLL section; a second calibration signal generator that generates a second calibration signal outside the PLL bandwidth to input in the adder in the PLL section; a demodulator that demodulates an output signal of the voltage controlled oscillator upon adjustment of a modulation level and a time gap between the first calibration signal and the second calibration signal; a low pass filter that blocks a high frequency component of the signal demodulated in the demodulator; a high pass filter that blocks a low frequency component of the signal demodulated in the demodulator; a modulation signal control circuit that compares an amplitude and a phase of an output of the low pass filter and an output of the high pass filter and generates control information; and a modulation signal adjustor that adjusts the first modulation input signal and the second modulation input signal in accordance with the control information.

BRIEF DESCRIPTION OF THE DRAWINGS

The above and other objects and features of the invention will appear more fully hereinafter from a consideration of the following description taken in connection with the accompanying drawings in which:

FIG. 10A illustrates the calculation of the amplitude difference and phase difference for explanation of the operation of modulation level adjustment and time gap adjustment;

FIG. 10B illustrates the calculation of the amplitude difference and phase difference for explanation of the operation of modulation level adjustment and time gap adjustment;

DETAILED DESCRIPTION OF PREFERRED EMBODIMENTS

Embodiments of the present invention will be described now in detail with reference to the accompanying drawings.

(Embodiment 1)

Figure 1:
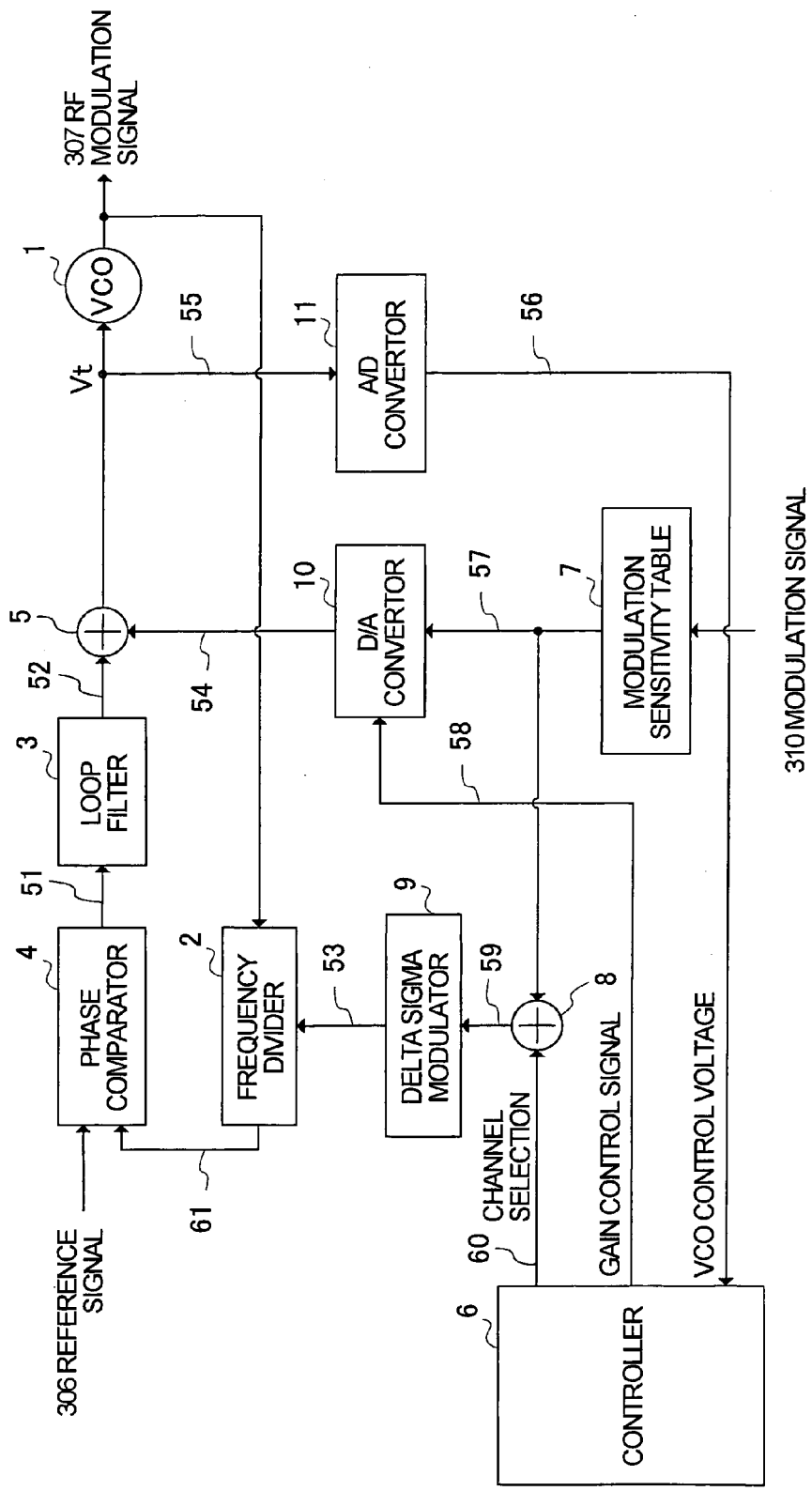
FIG. 1 is a block diagram showing a configuration of a conventional PLL modulation circuit.
Figure 2:
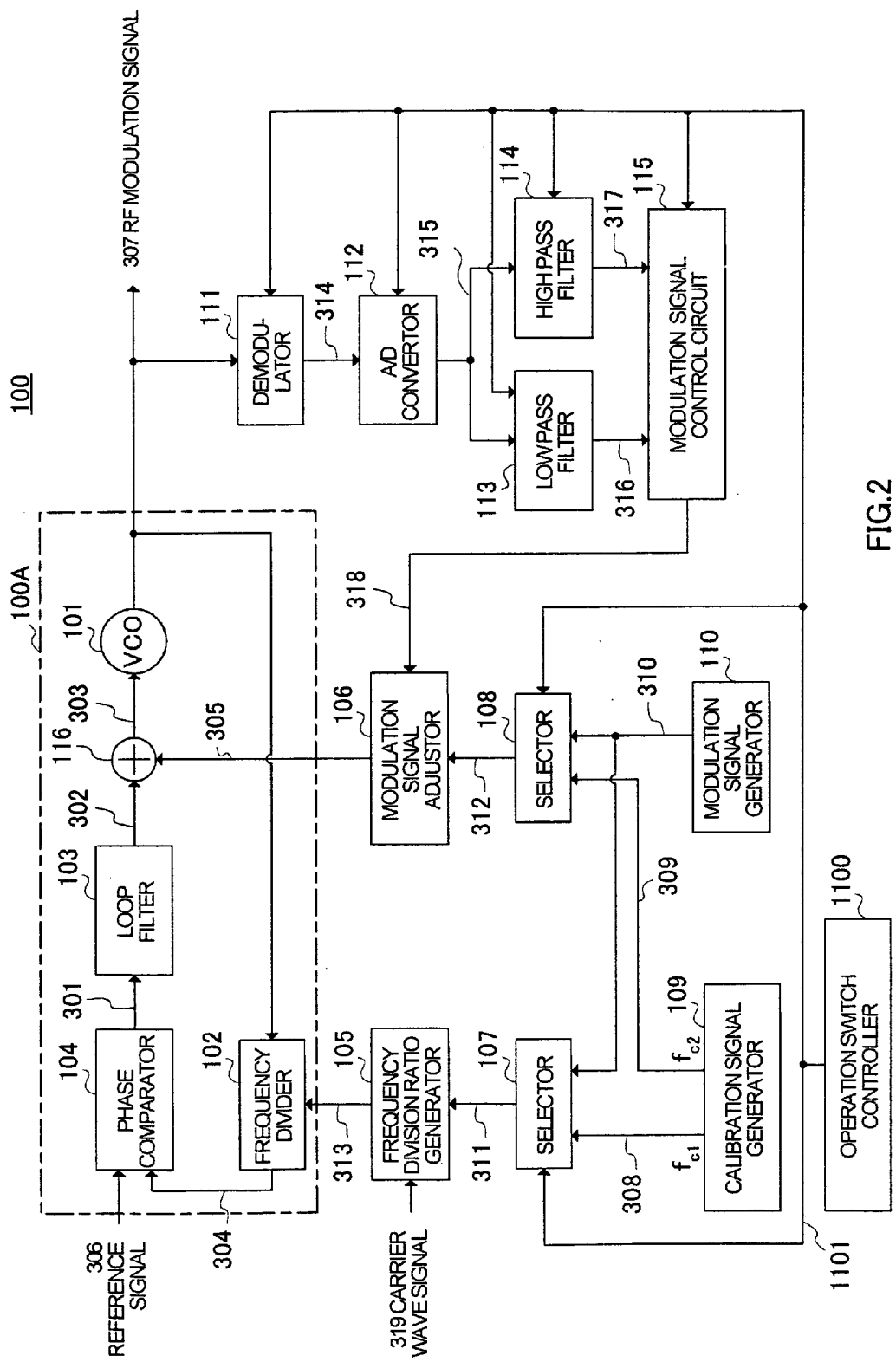
FIG. 2 is a block diagram showing a configuration of a PLL modulation circuit according to Embodiment 1 of the present invention.

FIG. 2 shows a simplified configuration of a PLL modulation circuit according to Embodiment 1 of the present invention. As shown in FIG. 2, PLL modulation circuit 100 according to Embodiment 1 of the present invention has PLL section 100A, which includes voltage controlled oscillator (VCO) 101, frequency divider 102, phase comparator 104, loop filter 103 and adder 116. VCO 101 changes the oscillation frequency in accordance with the voltage inputted in the control voltage terminal. Frequency divider 102 divides the frequency of RF modulation signal 307 outputted from VCO 101. Phase comparator 104 compares the phase of output signal 304 of frequency divider 102 and the phase of reference signal 306 and outputs a signal in accordance with the phase difference between the two signals. Loop filter 103 outputs signal 302, which is an equalized version of output signal 301 of phase comparator 104. Adder 116 adds the value of signal 302 from loop filter 103 and the value of modulation signal 305 and generates input signal 303 for VCO 101.

In addition, PLL modulation circuit 100 according to Embodiment 1 of the present invention has calibration signal generator 109, selectors 107 and 108, frequency division ratio generator 105, modulation signal adjustor 106 and operation switching controller 1100. Modulation signal generator 110 generates a modulation signal. Calibration signal generator 109 generates calibration signals 308 and 309. Selector 107 chooses one of calibration signal 308 and modulation signal 310 in accordance with selection instruction signal 1101 from operation switching controller 1100 and selector 108 chooses one of calibration signal 309 and modulation signal 310 in accordance with selection instruction signal 1101 from operation switching controller 1100. Frequency division ratio generator 105 combines output signal 311 of selector 107 and carrier frequency data 319 and generates frequency division ratio 313. Modulation signal adjustor 106 outputs modulation signal 305 with a corrected modulation level and time gap, based on output signal 312 of selector 108 and control information 318.

Operation switching controller 1100 alternately generates selection instruction signal 1101 that specifies the selection of calibration signals 308 and 309 and selection instruction signal 1101 that specifies the selection of modulation signal 310 and sends these signals to selectors 107 and 108.

Selectors 107 and 108 selects calibration signals 308 and 309 in accordance with selection instruction signal 1101 that specifies the selection of calibration signals 308 and 309 and sends the signals to modulation signal adjustor 106. In addition, selectors 107 and 108 select modulation signal 310 in accordance with selection instruction signal 1101 that specifies the selection o modulation signal 310 and sends the signal to frequency division ratio generator 105 and modulation signal adjustor 106.

Operation switching controller 1100 generates selection instruction signal 1101 that specifies the selection of calibration signals 308 and 309 while adjustment operation with respect to modulation signal 305 is in progress. Also, when operation switching controller 1100 generates selection instruction signal 1101 that specifies the selection of modulation signal 310 while modulation operation is progress.

In addition, PLL modulation circuit 100 according to Embodiment 1 of the present invention has demodulator 111, A/D convertor 112, low pass filter 113, high pass filter 114 and modulation signal control circuit 115. Demodulator 111, A/D convertor 112, low pass filter 113, high pass filter 114 and modulation signal control circuit 115 operate only when operation switching controller 1100 generates selection instruction signal 1101 that specifies the selection of calibration signals 308 and 309—that is, only while adjustment operation is in progress. Demodulator 111 modulates RF modulation signal 307 outputted from VCO 101. A/D convertor 112 converts output signal 314 of demodulator 111 to a digital signal. Low pass filter 113 receives output signal 315 from A/D convertor 112, blocks the high frequency component outside the bandwidth of PLL modulation circuit 100, and generates signal 316. High pass filter 114 receives output signal 315 from A/D convertor 112, blocks the high frequency component outside the bandwidth of PLL modulation circuit 100, and generates signal 317. Modulation signal control circuit 115 compares the phase and amplitude between output signal 316 of low pass filter 113 and output signal 317 of high pass filter 114 and transmits control information 318 to modulation signal adjustor 106.

Calibration signal generator 109 outputs two types of calibrations signals 308 and 309. In FIG. 2, calibration signal 308 is inputted in selector 107, and calibration signal 309 is inputted in selector 108. Next, the modulation operation of PLL modulation circuit 100 according to Embodiment 1 will be described below. During the modulation operation, selectors 107 and 108 select and output modulation signal 310 from modulation signal generator 110. Output signal (modulation signal) 311 of selector 107 generates the frequency division ratio in frequency divider 102 in frequency division ratio generator 105 and applies modulation to PLL section 100A. Meanwhile, as with output signal (modulation signal) 312 of selector 108, modulation signal 305, which is signal 302 with the modulation level and time gap adjusted in modulation signal adjustor 106, is inputted in adder 116, and modulation can be thus applied to input signal 303 of VCO 101. Modulation signal adjustor 106 has a control information holder, sets predetermined values in the control information holder at start, and receives control information 318 from modulation signal control circuit 115 and updates the control information held in the control information holder. Modulation signal adjustor 106 delays modulation signal 312 and adjusts the gain of modulation signal 312 in accordance with the control information held in the control information holder, and thus generates modulation signal 305 with its modulation level and time gap adjusted, and sends this signal to adder 116.

Modulation is thus performed by controlling the frequency division ratio of frequency divider 102 and the control voltage of VCO 101. That is, by thus performing modulation at two different points, wideband modulation is made possible.

Next, adjustment operation in PLL modulation circuit 100 according to Embodiment 1 will be explained. More specifically, the modulation level adjustment operation will be explained.

Calibration signal 308 for use in adjustment operation is a sinusoidal signal generated in calibration signal generator 109 having frequency component within the bandwidth of PLL modulation circuit 100. Calibration signal 309 is a sinusoidal signal generated in calibration signal generator 109 having frequency component outside the bandwidth of PLL modulation circuit 100. Calibration signals 308 and 309 are outputted simultaneously.

Figure 3:
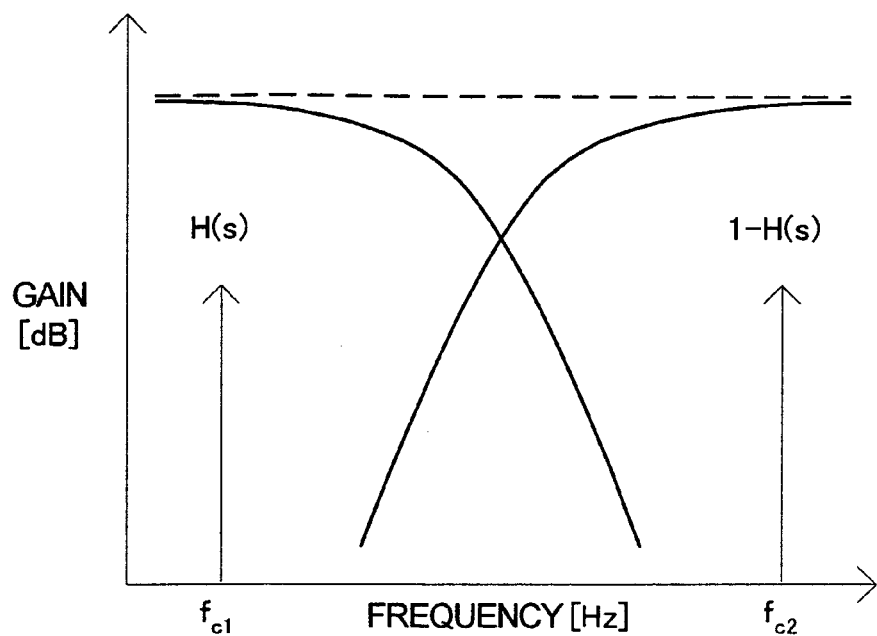
FIG. 3 shows frequency characteristics for explanation of the operation of the PLL modulation circuit.
Figure 4:
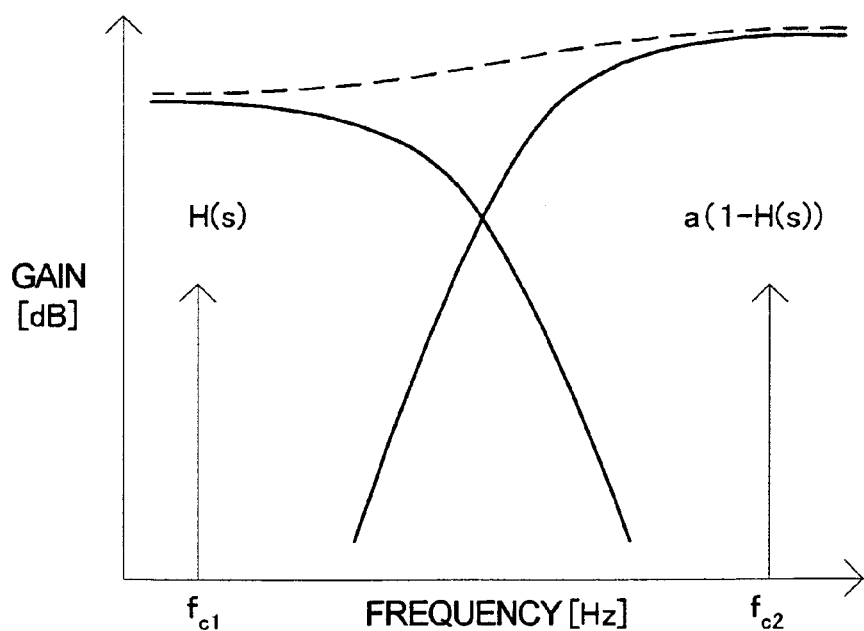
FIG. 4 shows frequency characteristics for explanation of the operation of the PLL modulation circuit.
Figure 5:
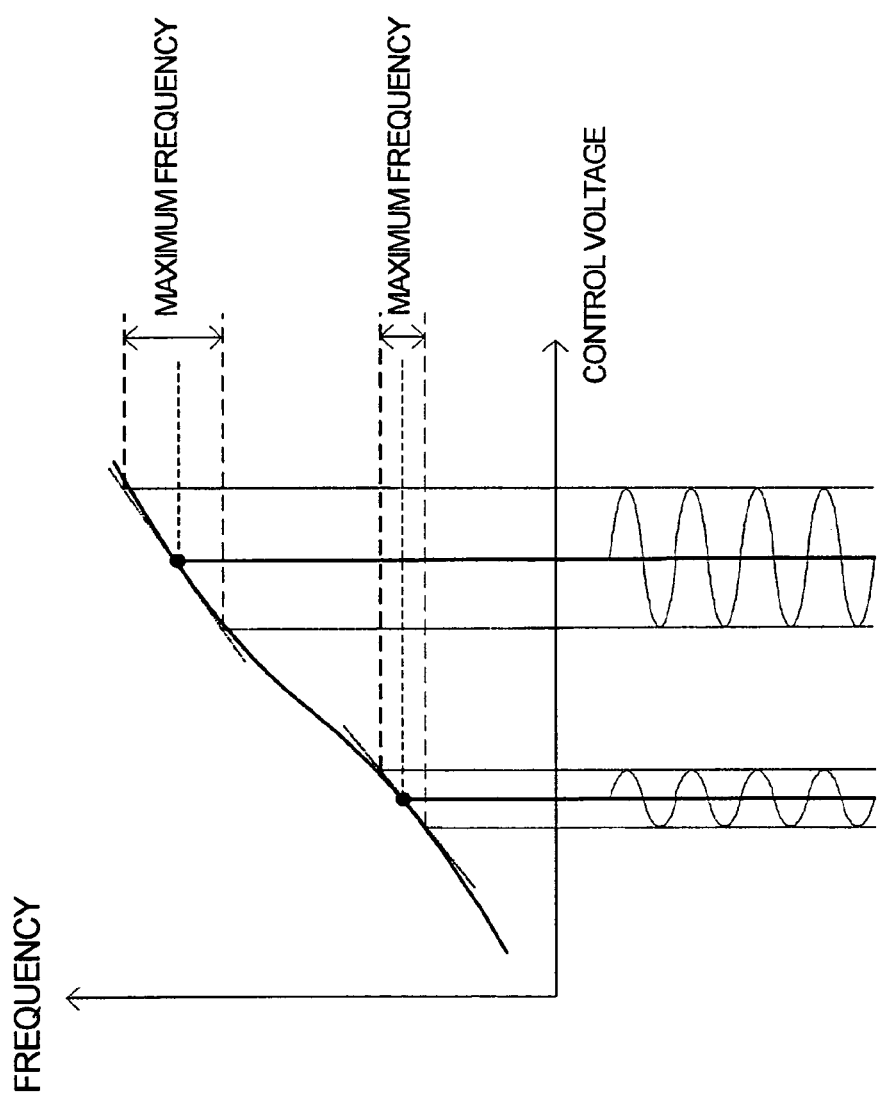
FIG. 5 illustrates an example of characteristics representing changes in output signal frequency in accordance with the control voltage in a general VCO.
Figure 6:
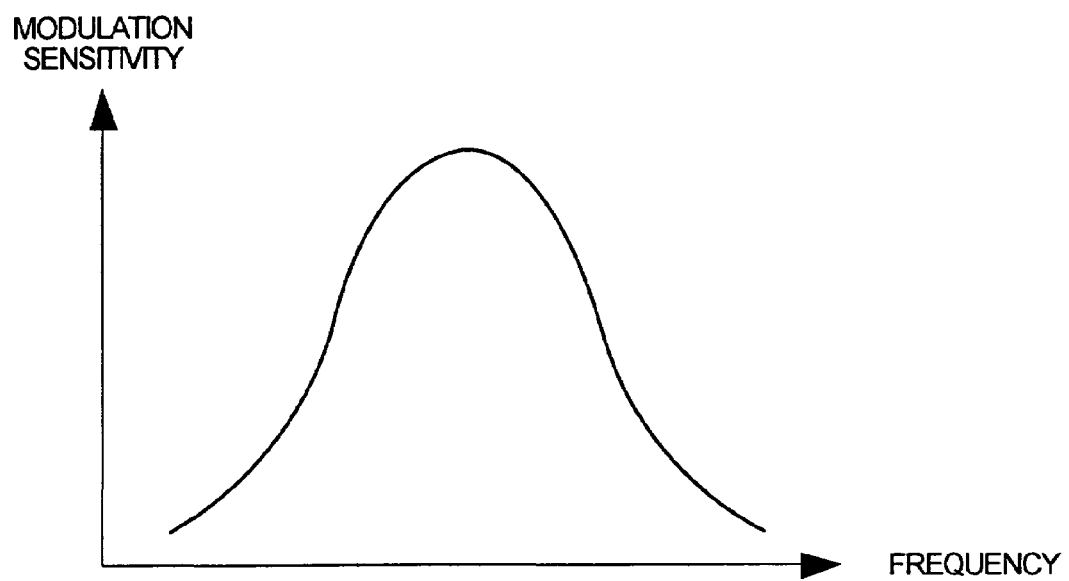
FIG. 6 illustrates oscillation frequency versus modulation sensitivity characteristics of a general VCO.

FIG. 3 illustrates transfer functions of PLL modulation circuit 100. When a modulation signal is added to the frequency division ratio set in frequency divider 102, low pass filter 113 of the transfer function H(s) in FIG. 3 blocks the high frequency component and allows only the low frequency component to pass. Meanwhile, when the modulation signal is added to the control voltage terminal of VCO 101, high pass filter 114 of the transfer function of 1-H(s) shown in FIG. 3 blocks the low frequency component and allows only the high frequency component to pass.

Accordingly, calibration signals 308 and 309 preferably have such frequencies that the gain of PLL modulation circuit 100 and these inputs do not affect each other. For example, like $f_{c1}$ and $f_{c2}$ shown in FIG. 3, calibration signal 308 is set in a frequency that makes the gain of the modulation outside the bandwidth of PLL modulation circuit 100 low enough, and calibration signal 309 is set in a frequency that makes the gain of the modulation inside the bandwidth of PLL modulation circuit 100 low enough. Calibration signal generator 109 sets calibration signals such that $f_{c1}$ and $f_{c2}$ have the same maximum frequency deviation. As mentioned above, the maximum width of change of the frequency division ratio and the comparison frequency of a reference signal is the maximum frequency deviation of the output signal, so that even if the modulation sensitivity varies with the control voltage in VCO 101, the amplitude of the output of VCO 101 does not vary.

During the adjustment operation, as described above, selector 107 selects and outputs calibration signal 308 and selector 108 selects and outputs calibration signal 309. The output signal (calibration signal) outputted via selector 107 is outputted from loop filter 103 as output signal 302, through frequency divider 102 and phase comparator 104. Frequency division ratio generator 105 generates the division ratio in accordance with carrier frequency data 319 and locks PLL section 100A in a frequency in accordance with carrier frequency data 319. When PLL section 100A locks in a frequency in accordance with carrier frequency data 319, calibration signal generator 109 outputs calibration signal 308 having a frequency within the bandwidth of PLL modulation circuit 100. Next, calibration signal 308, outputted from calibration signal generator 109, is inputted in frequency division ratio generator 105 through selector 107, and frequency division ratio generator 105 generates a frequency division ratio and applies modulation to frequency divider 102.

Meanwhile, signal (calibration signal) 312 outputted via selector 108 is outputted from modulation signal adjustor 106 as modulation signal 305. Adder 116 adds the value of adder 116 adds the value of output signal 302 of loop filter 103 and the value of modulation signal 305 as modulation signal adjustor 106. Output signal 303 of adder 116 is in inputted in VCO 101. VCO 101 outputs RF modulation signal 307 that is modulated by the frequency of signal 303 combining the modulation signal within the bandwidth of PLL modulation circuit 100 and the modulation signal outside the bandwidth of PLL modulation circuit 100. Demodulator 111 demodulates this RF modulation signal 307 and outputs modulation signal 314. A/D convertor 112 converts modulation signal 314 from demodulator 111 into a digital signal and outputs signal 315. Low pass filter 113 blocks the high frequency component of output signal 315 from A/D convertor 112 and outputs signal 316. High pass filter 114 blocks the low frequency component of output signal 315 from A/D convertor 112 and outputs signal 317. Modulation signal control circuit 115 compares the value of output signal 316 from low pass filter 113 and the value of output signal 317 from high pass filter 114. When there is a time gap between the two signals, modulation signal control circuit generates control information 318 that corrects the time gap in modulation signal adjustor 106. When there is an amplitude difference between the two signals, modulation signal control circuit 115 generates control information 318 that corrects the amplitude difference in modulation signal adjustor 106. Control information 318 generated in modulation signal control circuit 115 is sent to modulation signal adjustor 106, and modulation signal adjustor 106 updates the control information in the control information holder. In FIG. 2, modulation signal control circuit adjusts only output signal 312 of selector 108 where calibration signal 309 and modulation signal 310 pass, and yet modulation signal control circuit 115 is equally capable of adjusting output signal 311 of selector 107. Now, the operation and mechanism of adjusting the modulation level and time gap in modulation signal control circuit 115 will be explained. Signal 314 is outputted from demodulator 111 as a result of demodulating RF modulation signal 307 and is equivalent with output 303 of adder 116. By comparing calibration signals $f_{c1}$ and $f_{c2}$ included in this signal 314 and calculating the amplitude difference and time gap between the two signals, it is possible to adjust the modulation level and time gap between two points.

In addition, to make the comparison of the calibration signals more simple, signal 314 is converted to a digital signal through A/D convertor 112, and, thereafter, $f_{c1}$ and $f_{c2}$ are separated and extracted using low pass filter 113 and high pass filter 114. The conversion to a digital signal eliminates the influence of variation and furthermore makes it possible to calculate the amplitude difference and the time gap between two points from the amplitude information and phase information of output signal 316 and output signal 317. The method of comparing signals will be described in more detail later.

Figure 7:
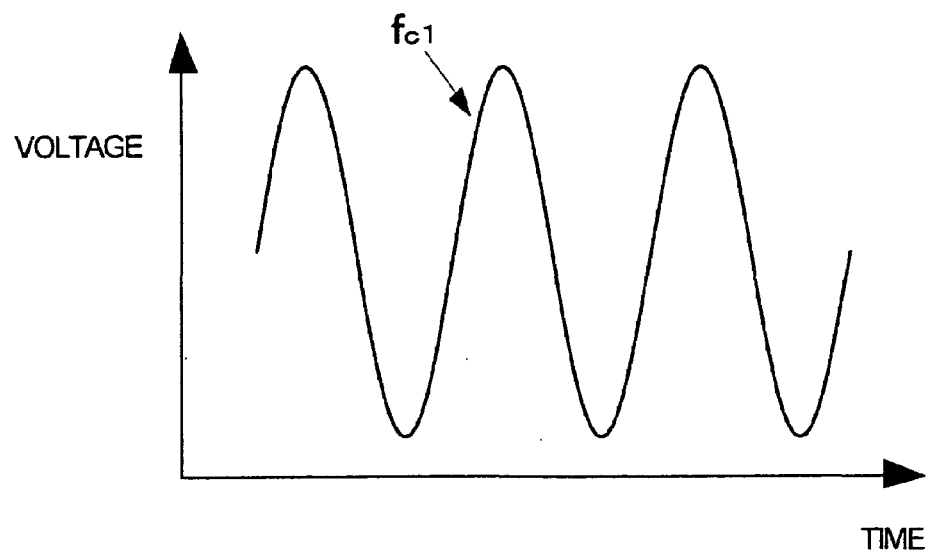
FIG. 7 illustrates an input signal within the bandwidth a PLL modulation circuit for explanation of modulation level adjustment.
Figure 8:
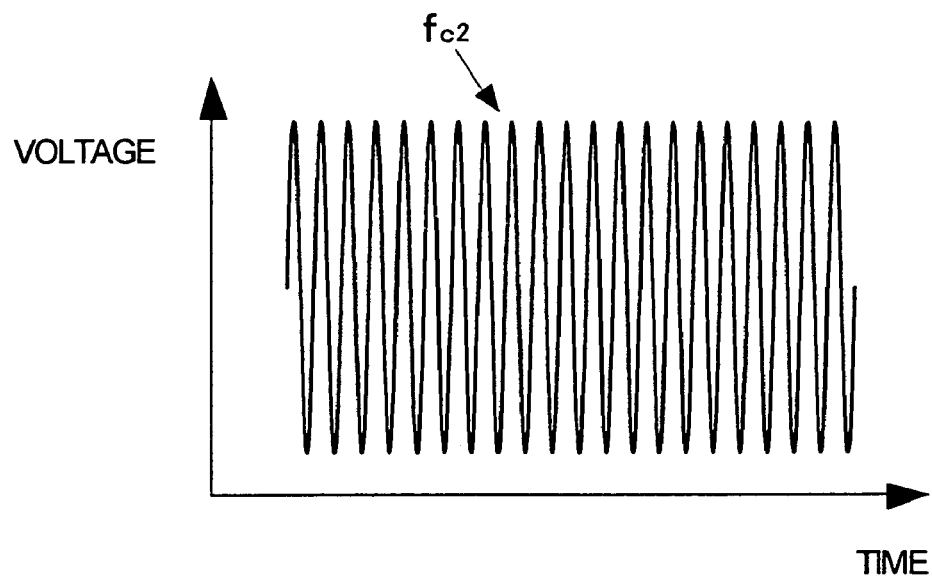
FIG. 8 illustrates an input signal within the bandwidth of a PLL modulation circuit for explanation of modulation level adjustment.

At this time, the frequencies of calibration signals $f_{c1}$ and $f_{c2}$ bear no relationship to each other except that $f_{c1}$ has a frequency within the PLL bandwidth and $f_{c2}$ has a frequency outside the PLL bandwidth, and are adjustable. However, the frequencies of $f_{c1}$ and $f_{c2}$ preferably hold the relationship that one is N times the other (where N is an integer) or the relationship that both are N times the same given frequency, so that the time required in adjustment can be shortened. Next, the method of phase difference detection and time gap detection in modulation signal control circuit will be described with operation examples. As mentioned earlier, calibration signals $f_{c1}$ and $f_{c2}$ for use here are set such that $f_{c1}$ is set in a frequency that makes the gain of the modulation outside the bandwidth of PLL modulation circuit 100 low enough and $f_{c2}$ is set in a frequency that makes the gain of the modulation inside the bandwidth of PLL modulation circuit 100 low enough. FIG. 7 and FIG. 8 illustrate signals $f_{c1}$ and $f_{c2}$ respectively.

Figure 9:
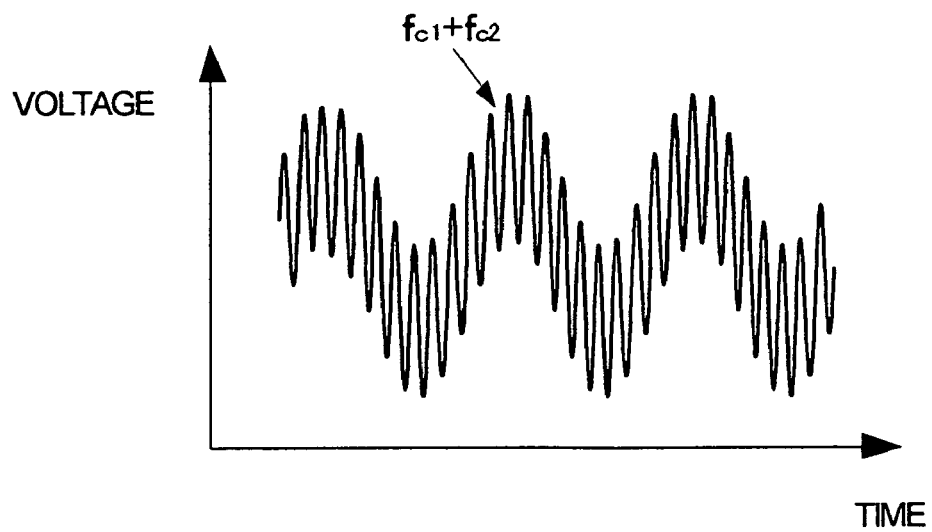
FIG. 9 illustrates a combined signal for explanation of the operation of modulation level adjustment.

FIG. 9 illustrates a signal demodulated in demodulator 111 that is equivalent with signal 307, which is outputted from adder 116 as a result of combining calibration signals $f_{c1}$ and $f_{c2}$ This signal 314 is A/D converted in a sampling frequency at which the original signal can be extracted with good accuracy, and the result is inputted in low pass filter 113 and high pass filter 114. Through this operation, from signal 316, a signal having the same frequency as calibration signal $f_{c1}$ can be extracted, and, from signal 317, a signal having the same frequency as calibration signal $f_{c2}$ can be extracted.

Output signals 317 and 318 of low pass filter 113 and high pass filter 114 are inputted in modulation signal control circuit 115. FIG. 10A illustrates the comparison operation in modulation signal control circuit 115 in a case where calibration signals $f_{c1}$ and $f_{c2}$ hold the relationship of one being N times the other. The amplitude difference between the signals inputted in modulation signal control circuit 115 can be calculated by comparing the peak amplitude of the signals. In addition, the time gap can be calculated by comparing the phases of the signals as the signals are inputted, and there is no time gap between them if their phases match on a regular basis. In the case of FIG. 10A, the phases of the signals match per cycle of calibration signal $f_{c1}$.

As shown in FIG. 10B, when calibration signals $f_{c1}$ and $f_{c2}$ do not hold the relationship of one being N times the other and only one signal has a delay, modulation signal adjustor 106 is controlled through modulation signal control circuit 115 such that the other signal is delayed and the phases of calibration signals $f_{c1}$ and $f_{c2}$ match per cycles of a least common multiple of the frequencies of calibration signals $f_{c1}$ and $f_{c2}$. In this PLL modulation circuit 100 according to Embodiment 1 of the present invention, PLL section 100A receives as input signals at two different points and detects the amplitude difference and time gap between the two signals, and modulation signal adjustor 106 adjusts modulation signal 312 such that modulation signal 312 is corrected based on these amplitude difference and time gap. By this means, Embodiment 1 of the present invention improves modulation accuracy. This PLL modulation circuit 100 is applicable, for example, to modulation systems including polar modulation systems, and to various wireless communication apparatuses including mobile communication terminals and wireless base station apparatuses. Embodiment 1 of the present invention thus provides modulation systems and wireless communication apparatuses that improve modulation accuracy.

In addition, demodulator 111, A/D convertor 112, low pass filter 113, high pass filter 114, and modulation signal control circuit 115 need not be integrated in a single IC and it is equally possible to provide, externally, a demodulator and adjusting device. Moreover, calibration signals 308 and 109 are by no means limited to sinusoidal signals.

(Embodiment 2)

Figure 11:
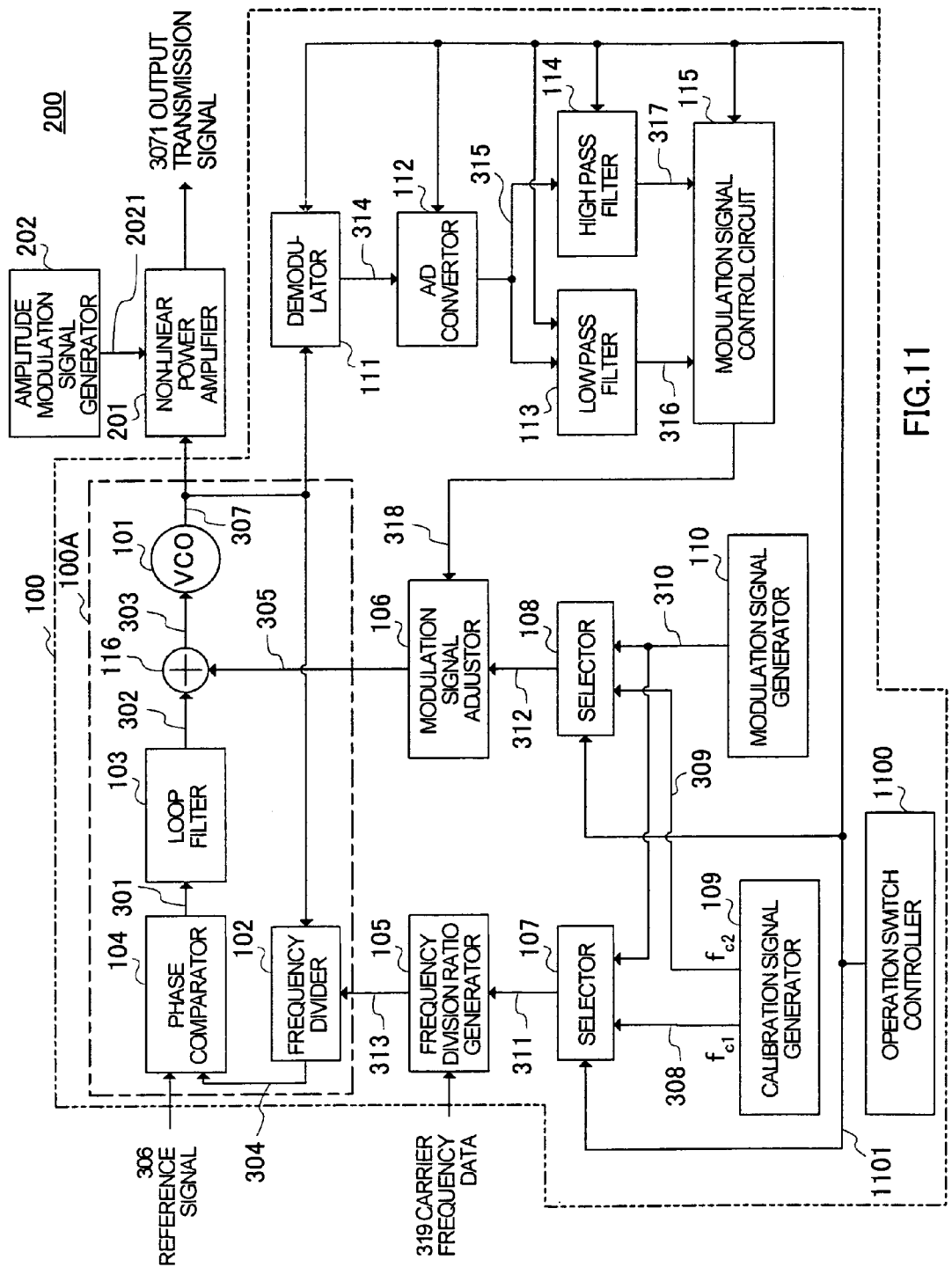
FIG. 11 is a block diagram showing a configuration of a polar modulation apparatus according to Embodiment 2 of the present invention.

FIG. 11 is a block diagram showing the configuration of a polar modulation apparatus according to Embodiment 2 of the present invention. Parts in Embodiment 2 of the present invention that are identical to ones in Embodiment 1 will be assigned the same reference numerals as in Embodiment 1 without further explanations.

As shown in FIG. 11, polar modulation apparatus 200 according to Embodiment 2 of the present invention has PLL modulation circuit 100 of Embodiment 1 of the present invention, and, in addition, non-linear power amplifier 201 and amplitude modulation signal generator 202.

RF modulation signal 307 from VCO 101 of PLL modulation circuit 100 is inputted in non-linear power amplifier 201 as a phase modulation signal. Amplitude modulation signal generator 202 generates amplitude modulation signal 2021 ad sends it to non-linear power amplifier 201 as a control signal. In accordance with the voltage value of amplitude modulation signal 2021, non-linear power amplifier 201 modulates RF modulation signal 307 and generates and outputs output transmission signal 3071.

Given the above configuration, Embodiment 2 of the present invention provides a polar modulation apparatus that improves modulation accuracy.

In addition to the above-described configuration, Embodiment 2 of the present invention can also be configured such that demodulator 111 demodulates output transmission signal 3071 from non-linear power amplifier 201 and sends the result to modulation signal control circuit 115 through A/D convertor 112, low pass filter 113 and high pass filter 114. In this case, demodulator 111 needs to demodulate output transmission signal 3071 from non-linear power amplifier 201 in a state where amplitude modulation signal generator 202 does not send amplitude modulation signal 2021 to non-linear power amplifier 201.

(Embodiment 3)

Figure 12:
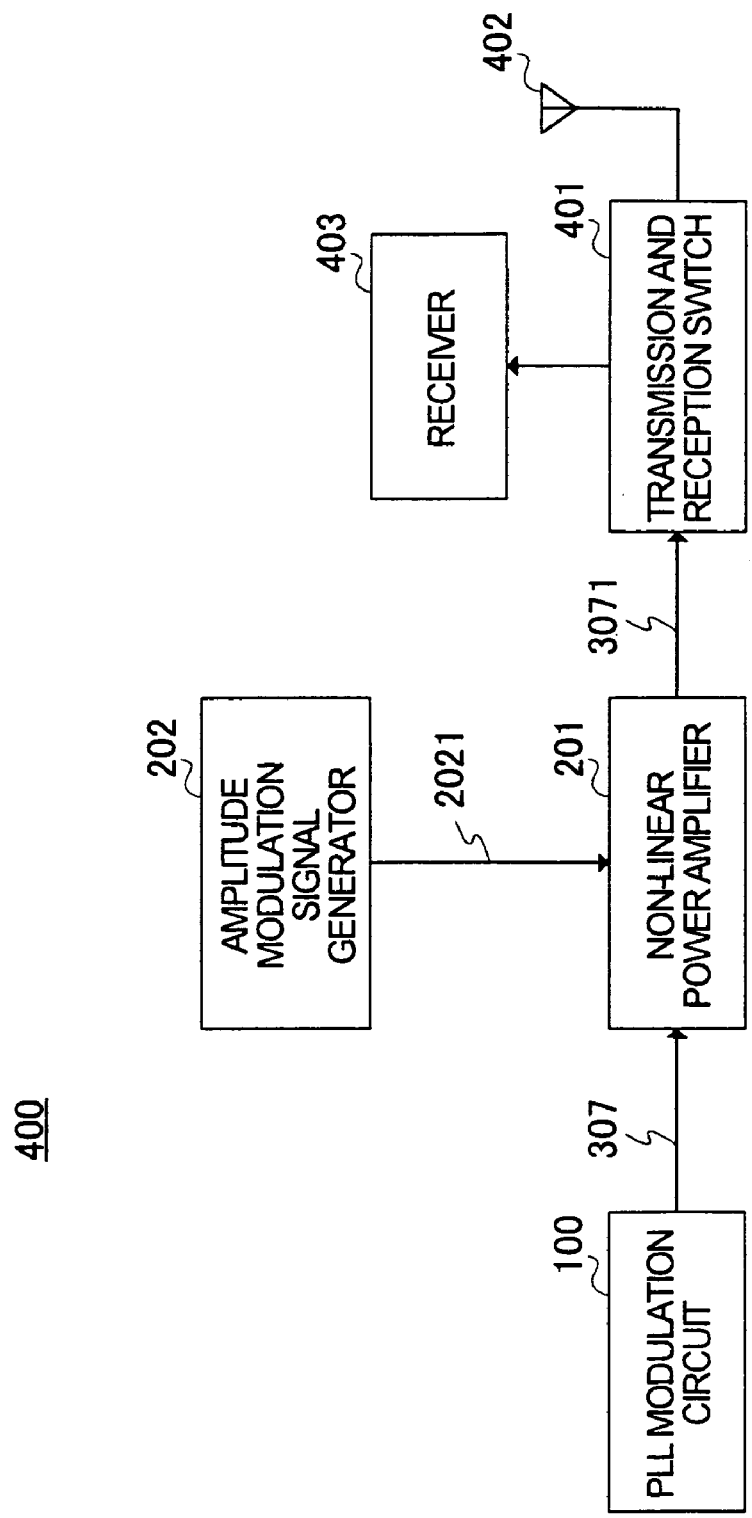
FIG. 12 is a block diagram showing a configuration of a wireless communication apparatus according to Embodiment 3 of the present invention.

FIG. 12 is a block diagram showing the configuration of a wireless communication apparatus according to Embodiment 3 of the present invention. Parts in Embodiment 3 of the present invention that are identical to ones in Embodiment 2 will be assigned the same reference numerals without further explanations.

As shown in FIG. 12, wireless communication apparatus 400 according to Embodiment 3 of the present invention has PLL modulation circuit 100, non-linear power amplifier 201, and amplitude modulation signal generator 202 in polar modulation apparatus 200 of Embodiment 2 of the present invention, and, in addition, transmission and reception switch 401, antenna 402, and receiver 403. Transmission and reception switch 401 switches between supplying transmission signals from PLL modulation circuit 100 of polar modulation apparatus to antenna 402 and supplying received signals from antenna 402 to receiver 403. Non-linear power amplifier 201 sends output transmission signal 3071 to transmission and reception switch 401. Transmission and reception switch 401 receives output transmission signal 3071 from non-linear power amplifier 201 and sends it to antenna 402. Antenna 402 receives output transmission signal 3071 and generates and transmits a wireless transmission signal.

In addition, antenna 402 receives a transmission signal from the wireless communication apparatus of a communicating party and generates and sends a received signal to transmission and reception switch 401. Transmission and reception switch 401 receives the received signal from antenna 402 and sends it to receiver 403.

According to the above configuration, there is provided a wireless communication apparatus with a PLL modulation circuit and polar modulation apparatus that improve modulation accuracy, and thus communication of high accuracy and quality is made possible.

According to a first aspect of the present invention, a PLL modulation circuit has a configuration having: a PLL section including a voltage controlled oscillator, a frequency divider that frequency divides an output signal of the voltage controlled oscillator, a phase comparator that compares an output signal of the frequency divider and a reference signal, a loop filter that equalizes an output of the phase comparator, and an adder that adds an output of the loop filter and a second modulation input signal and sends a result to the voltage controlled oscillator; a first modulation signal generator that, based on a modulation signal inputted, generates a first modulation input signal to input in the frequency divider in the PLL section; a second modulation signal generator that, based on the modulation signal inputted, generates the second modulation input signal to input in the adder in the PLL section; a first calibration signal generator that generates a first calibration signal within a PLL bandwidth to input in the frequency divider in the PLL section; a second calibration signal generator that generates a second calibration signal outside the PLL bandwidth to input in the adder in the PLL section; a demodulator that demodulates an output signal of the voltage controlled oscillator upon adjustment of a modulation level and a time gap between the first calibration signal and the second calibration signal; a low pass filter that blocks a high frequency component of the signal demodulated in the demodulator; a high pass filter that blocks a low frequency component of the signal demodulated in the demodulator; a modulation signal control circuit that compares an amplitude and a phase of an output of the low pass filter and an output of the high pass filter and generates control information; and a modulation signal adjustor that adjusts the first modulation input signal and the second modulation input signal in accordance with the control information.

According to this configuration, the first calibration signal and second calibration signal are demodulated and filtered through the low pass filter and high pass filter. The outputs are compared to determine the amplitude difference and time gap and the control information for the modulation signal adjustor is generated. In accordance with this control information, the first modulation input signal and second modulation input signal are adjusted. Thus, this configuration provides a PLL modulation circuit that improves modulation accuracy.

A PLL modulation circuit according to a second aspect of the present invention has a configuration in which, in the first aspect of the present invention, the first calibration signal and second calibration signal are each a sinusoidal signal.

This configuration maintains features and advantages of the above first aspect of the present invention. In addition, according to this configuration, the first calibration signal and second calibration signal are each sinusoidal signal, so that the outputs obtained through the low pass filter and high pass filter are compared by the amplitude and phase and the amplitude difference and phase difference between the outputs are determined accurately.

A PLL modulation circuit according to a third aspect of the present invention has a configuration in which, in the first aspect of the present invention, the frequency of the first calibration signal and the frequency of the second calibration signal are configured such that one is an integral multiple of the other.

This configuration maintains features and advantages of the above first aspect of the present invention. In addition, according to this configuration, the frequency of the first calibration signal and the frequency of the second calibration signal are configured such that one is an integral multiple of the other, so that the time required for adjustment can be shortened.

A polar modulation apparatus according to a fourth aspect of the present invention has a configuration having: an amplitude modulation signal generator that generates an amplitude modulation signal; a PLL modulation circuit; and a nonlinear power amplifier that receives a high frequency modulation signal outputted from the PLL modulation circuit as a phase modulation signal, modulates the phase modulation signal in accordance with a voltage value of the amplitude modulation signal, and generates an output transmission signal, and, in this polar modulation apparatus, the PLL modulation circuit has: a PLL section including a voltage controlled oscillator, a frequency divider that frequency divides an output signal of the voltage controlled oscillator, a phase comparator that compares an output signal of the frequency divider and a reference signal, a loop filter that equalizes an output of the phase comparator, and an adder that adds an output of the loop filter and a second modulation input signal and sends a result to the voltage controlled oscillator; a first modulation signal generator that, based on a modulation signal inputted, generates a first modulation input signal to input in the frequency divider in the PLL section; a second modulation signal generator that, based on the modulation signal inputted, generates the second modulation input signal to input in the adder in the PLL section; a first calibration signal generator that generates a first calibration signal within a PLL bandwidth to input in the frequency divider in the PLL section; a second calibration signal generator that generates a second calibration signal outside the PLL bandwidth to input in the adder in the PLL section; a demodulator that demodulates an output signal of the voltage controlled oscillator upon adjustment of a modulation level and a time gap between the first calibration signal and the second calibration signal; a low pass filter that blocks a high frequency component of the signal demodulated in the demodulator; and a high pass filter that blocks a low frequency component of the signal demodulated in the demodulator; a modulation signal control circuit that compares an amplitude and a phase of an output of the low pass filter and an output of the high pass filter and generates control information; and a modulation signal adjustor that adjusts the first modulation input signal and the second modulation input signal in accordance with the control information.

According to this configuration, the first calibration signal and second calibration signal are demodulated and filtered through the low pass filter and high pass filter. The outputs are compared to determine the amplitude difference and time gap and the control information for the modulation signal adjustor is generated. In accordance with this control information, the first modulation input signal and second modulation input signal are adjusted. Thus, this configuration provides a polar modulation apparatus that improves modulation accuracy.

A wireless communication apparatus according to a fifth aspect of the present invention has a configuration including: the polar modulation apparatus of claim 4; a receiver that modulates a received signal; an antenna; and a transmission and reception switch that switches between supplying a transmission signal from the polar modulation apparatus to the antenna and supplying a received signal from the antenna to the receiver.

According to the above configuration, there is provided a wireless communication apparatus with a PLL modulation circuit and polar modulation apparatus that improve modulation accuracy, and thus communication of high accuracy and quality is made possible.

The present invention is not limited to the above described embodiments, and various variations and modifications may be possible without departing from the scope of the present invention.

This application is based on Japanese Patent Application No. 2004-073171 filed on Mar. 15, 2004, the entire content of which is expressly incorporated by reference herein.

INDUSTRIAL APPLICABILITY

The present invention is applicable for use in wireless communication apparatus such as mobile communication apparatuses and wireless base station apparatuses.

The invention claimed is:
1. A PLL modulation circuit comprising:
   a PLL section having:
      a voltage controlled oscillator;
      a frequency divider that frequency divides an output signal of the voltage controlled oscillator;
      a phase comparator that compares an output signal of the frequency divider with a reference signal;
      a loop filter that equalizes an output of the phase comparator; and
      an adder that adds an output of the loop filter to a second modulation input signal and sends a result of adding to the voltage controlled oscillator;

a first modulation signal generator that, based on a modulation signal inputted, generates a first modulation input signal to input to the frequency divider in the PLL section;

a second modulation signal generator that, based on said modulation signal inputted, generates the second modulation input signal to input to the adder in the PLL section;

a first calibration signal generator that generates a first calibration signal within a PLL bandwidth to input to the frequency divider in the PLL section;

a second calibration signal generator that generates a second calibration signal outside the PLL bandwidth to input to the adder in the PLL section;

a demodulator that demodulates an output signal of the voltage controlled oscillator upon adjustment of a modulation level and a time gap between the first calibration signal and the second calibration signal;

a low pass filter that blocks a high frequency component of the demodulation signal demodulated in the demodulator;

a high pass filter that blocks a low frequency component of the demodulation signal a modulation signal control circuit that compares an amplitude and a phase of an output of the low pass filter and an output of the high pass filter and generates control information; and a modulation signal adjustor that adjusts the first modulation input signal and the second modulation input signal in accordance with the control information.

2. The PLL modulation circuit of claim 1, wherein the first calibration signal and the second calibration signal are each a sinusoidal signal.

3. The PLL modulation circuit of claim 1, wherein a frequency of the first calibration signal and a frequency of the second calibration signal are configured such that one is an integral multiple of the other.

4. A polar modulation apparatus comprising:
an amplitude modulation signal generator that generates an amplitude modulation signal;
a PLL modulation circuit; and
a nonlinear power amplifier that receives a high frequency modulation signal outputted from the PLL modulation circuit as a phase modulation signal, modulates the phase modulation signal in accordance with a voltage value of the amplitude modulation signal, and generates an output transmission signal,
wherein the PLL modulation circuit comprises:
a PLL section having:
a voltage controlled oscillator;
a frequency divider that frequency divides an output signal of the voltage controlled oscillator;
a phase comparator that compares an output signal of the frequency divider with a reference signal;
a loop filter that equalizes an output of the phase comparator; and
an adder that adds an output of the loop filter to a second modulation input signal and sends a result of adding to the voltage controlled oscillator;

a first modulation signal generator that, based on a modulation signal inputted, generates a first modulation input signal to input to the frequency divider in the PLL section;

a second modulation signal generator that, based on said modulation signal inputted, generates the second modulation input signal to input to the adder in the PLL section;

a first calibration signal generator that generates a first calibration signal within a PLL bandwidth to input to the frequency divider in the PLL section;

a second calibration signal generator that generates a second calibration signal outside the PLL bandwidth to input to the adder in the PLL section;

a demodulator that demodulates an output signal of the voltage controlled oscillator upon adjustment of a modulation level and a time gap between the first calibration signal and the second calibration signal;

a low pass filter that blocks a high frequency component of the demodulation signal demodulated in the demodulator; and a high pass filter that blocks a low frequency component of the demodulation signal;

a modulation signal control circuit that compares an amplitude and a phase of an output of the low pass filter and an output of the high pass filter and generates control information; and a modulation signal adjustor that adjusts the first modulation input signal and the second modulation input signal in accordance with the control information.

5. A wireless communication apparatus comprising:
the polar modulation apparatus of claim 4;
a receiver that modulates a received signal;
an antenna; and
a transmission and reception switch that switches between supplying a transmission signal from the polar modulation apparatus to the antenna and supplying a received signal from the antenna to the receiver.

* * * * *